United States Patent
Sundstrom

(10) Patent No.: US 7,120,048 B2
(45) Date of Patent: Oct. 10, 2006

(54) NONVOLATILE MEMORY VERTICAL RING BIT AND WRITE-READ STRUCTURE

(75) Inventor: Lance Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 141 days.

(21) Appl. No.: 10/874,132

(22) Filed: Jun. 21, 2004

(65) Prior Publication Data

US 2006/0007728 A1    Jan. 12, 2006

(51) Int. Cl.
*G11C 11/00* (2006.01)
(52) U.S. Cl. .................... 365/158; 365/173
(58) Field of Classification Search ............... 365/158, 365/173
See application file for complete search history.

(56) References Cited

U.S. PATENT DOCUMENTS

| | | | |
|---|---|---|---|
| 5,173,873 A | 12/1992 | Wu et al. | 365/173 |
| 5,477,482 A | 12/1995 | Prinz | 365/129 |
| 5,541,868 A | 7/1996 | Prinz | 365/98 |
| 5,852,531 A * | 12/1998 | Yamada | 360/324.1 |
| 5,965,283 A * | 10/1999 | Solin et al. | 428/812 |
| 5,966,008 A * | 10/1999 | Maier et al. | 324/96 |
| 6,111,784 A | 8/2000 | Nishimura | 365/173 |
| 6,172,902 B1 * | 1/2001 | Wegrowe et al. | 365/158 |
| 6,351,410 B1 | 2/2002 | Nakao et al. | 365/171 |
| 6,552,554 B1 | 4/2003 | Prinz et al. | 324/719 |
| 6,577,526 B1 * | 6/2003 | Schwarzl | 365/158 |
| 6,581,480 B1 * | 6/2003 | May et al. | 73/862.333 |
| 6,757,192 B1 | 6/2004 | Mukasa et al. | 365/173 |
| 6,906,947 B1 * | 6/2005 | Bloomquist et al. | 365/158 |
| 6,927,073 B1 | 8/2005 | Huggins | 438/3 |
| 2004/0032765 A1 * | 2/2004 | Deak | |

OTHER PUBLICATIONS

Zhu, "MRAM: Promises and Challenges," Electrical and Computer Engineering Nov. 2001.

* cited by examiner

*Primary Examiner*—Michael Tran
(74) *Attorney, Agent, or Firm*—McDonnell Boehnen Hulbert & Berghoff LLP

(57) ABSTRACT

A magnetoresistive memory cell and array are provided for nonvolatile storage of binary information. According to an embodiment, a memory cell has a ring-shaped magnetoresistive multilayer element (or bit). A plurality of vias pass through a center hole in the ring-shaped element. Each end of each via is coupled with a separate write-read line segment that extends radially from the center hole past a perimeter of the ring-shaped element. The write-read lines are configured to generate magnetic fields for switching a magnetization direction of one or more layers of the ring-shaped bits in the array.

27 Claims, 8 Drawing Sheets

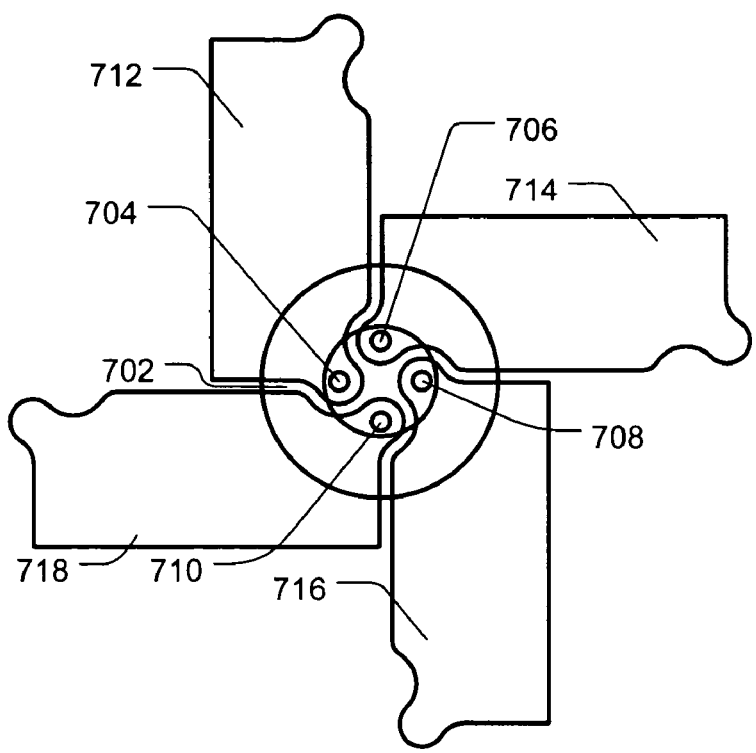
FIG. 7(a) Top View
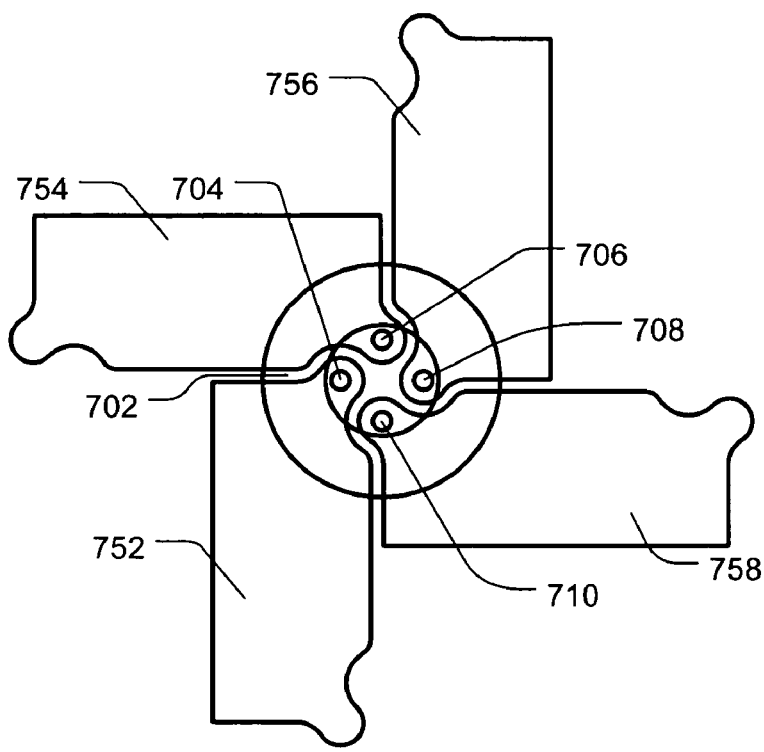
FIG. 7(b) Top View

Top Combined View

Top View

NONVOLATILE MEMORY VERTICAL RING BIT AND WRITE-READ STRUCTURE

GOVERNMENT RIGHTS

The United States Government has acquired certain rights in this invention pursuant to Contract No. N00030-02-C-0006 awarded by the Strategic Projects Branch of the Navy.

BACKGROUND

1. Field

The present invention relates generally to magnetic memory and more specifically to magnetoresistive memory elements.

2. Background and Related Art

In magnetoresistive random access memory (MRAM), data is stored by using an electric current to create a magnetic field for switching a magnetic direction of a ferromagnetic layer of a multilayer memory element (also known as a bit). An MRAM is described as a type of nonvolatile memory because a logical state of a memory element will persist even when power is removed from the memory device. Although there are other types of nonvolatile memory chips, MRAM allows rapid read and write sequences. And unlike dynamic random access memory (DRAM), MRAM does not require a constant flow of current to retain its data—thus consuming less power.

Traditional MRAM elements have a rectangular shape with tapered bit ends and a linear magnetization. In these linear elements, magnetic poles generated at bit-ends can form demagnetizing fields within the bit and stray fields outside the bit. The demagnetizing fields can create complex magnetic domains within the bit that are detrimental to switching thresholds and data retention. The stray fields can interfere with adjacent bits. Tapering the bit ends has been useful for spreading and weakening the magnetic poles; however, problems have not been eliminated.

Ring-shaped magnetoresistive elements have been proposed as a solution to the problem of demagnetizing and stray fields. The circular magnetization mode eliminates magnetic poles and the resulting demagnetizing and stray fields. However, implementations of ring-shaped elements have been limited to low impedance pseudo spin valve (PSV) or spin valve (SV) giant magnetoresistive (GMR) devices and require that a high current be passed vertically (perpendicular to the plane) through the element to generate a circumferential magnetic field that writes the bit. Because of the shape of the element or connecting traces, the vertical current may not be uniform and instead may concentrate near points of contact with connecting lines. Additionally, concept proposals show diagonally paired word lines that are used in write sequences for applying a hard-axis (radial-axis) magnetic field to the element. These diagonal lines are of different lengths—each with a different series resistance—and thus make uniform write and read current pulse generation more difficult and add complexity to the write and read decode drive electronics.

SUMMARY

The present invention provides an apparatus that solves several of the magnetic memory problems outlined above. In accordance with a first aspect, a magnetoresistive memory cell is provided having a ring-shaped magnetoresistive multilayer element and at least one write-read line for switching a magnetization direction of a ferromagnetic layer of the element. According to an embodiment, the ring-shaped element is shaped like a hollow cylinder with a base, a top, a hole passing through the center, and a curved surface at the perimeter. Each write-read line is comprised of several segments: i.e., a via; a top write-read line segment; and a base write-read line segment. The via is arranged within the hole of the ring-shaped element and passes from the base to the top. The top write-read line segment is arranged near the top and is coupled with the via. Likewise, the base write-read line segment is arranged near the base and is coupled with the via. Both the top and base write-read line segments extend radially from the via toward the perimeter and are electrically isolated from the ring-shaped element itself.

In operation, a current passing through the write-read line creates a magnetic field that acts on the ring-shaped element in either a clockwise or counterclockwise direction about the center hole. The applied magnetic field is useful for switching the magnetization direction of one or more ferromagnetic layers.

According to a further embodiment, a bit sense line is coupled with the top and base of the element and is used to create a voltage difference vertically across the element for determining (or reading) a logical (binary) state of the element. Because the write-read line(s) provide an alternative current pathway, a current does not need to be passed through the bit sense line during a write sequence. This feature also allows the use of alternative embodiments of the ring-shaped element such as pseudo spin-valve (PSV), spin-valve (SV), or magnetic tunnel junction (MTJ) elements, for example.

Another aspect provides a ring-shaped multilayer element with four electrically isolated vias passing through a hole in the element. Each via is coupled with a top write-read trace near the top of the element and coupled with a base write-read trace near a base of the element. Each of the eight write-read traces extends radially from the hole past a perimeter of the element. Preferably, each via is isolated within one quadrant of the hole. Likewise, according to an embodiment, each write-read trace is arranged within a quadrant of the element and passes near the respective edge (either top or base). Thus, a combined effect of the write-read traces is to provide an equivalent of four turns of current distributed around the surface of the top and the surface of the base.

In yet another aspect, a magnetoresistive memory device provides a plurality of ring-shaped multilayer magnetoresistive elements arranged in rows and columns, a plurality of row write-read lines, and a plurality of column write-read lines. Each row of elements is associated with a row write-read line. Likewise, each column of elements is associated with a column write-read line.

According to an embodiment, each row write-read line has a first half that begins on a first side of the row and passes to a second side of the row. A second half of the row write-read line begins on the second side of the row and passes back to the first side of the row. A loop interconnects the first half and second half at the second side of the row. Both the first half and second half of the row write-read line pass through a center hole of each element in the associated row. Thus, each element is configured with a row write-read line passing twice through its center hole. Column write-read lines may be arranged in a similar configuration with each column write-read line passing twice through the center hole of each associated element.

In a further embodiment, write-read lines pass from the top of one element to the top of a second element and (after passing through the center of the second element) from the base of the second element to the base of a third element. Thus, each write-read line has a repeating pattern that spans two elements. Because the two-element repeating pattern extends along both rows and columns, the device has a minimum write-read repeating pattern that spans a four-by-four array of elements. In an alternative embodiment, a minimum write-read repeating pattern of a single element is provided by passing a write-read line from the base of a first element to the top of a second element and (after passing through the center of the second element) from the base of the second element to the top of a third element.

These as well as other aspects and advantages of the embodiments will become apparent to those of ordinary skill in the art by reading the following detailed description with appropriate reference to the accompanying drawings.

BRIEF DESCRIPTION OF THE DRAWINGS

FIG. 7(a) is a top view of an embodiment of a memory cell showing a memory element, center vias and four top write-read lines.

FIG. 7(b) is a top view of an embodiment of a memory cell showing a memory element, center vias and four base write-read lines.

DETAILED DESCRIPTION OF EMBODIMENTS

1. Overview

Figure 1:
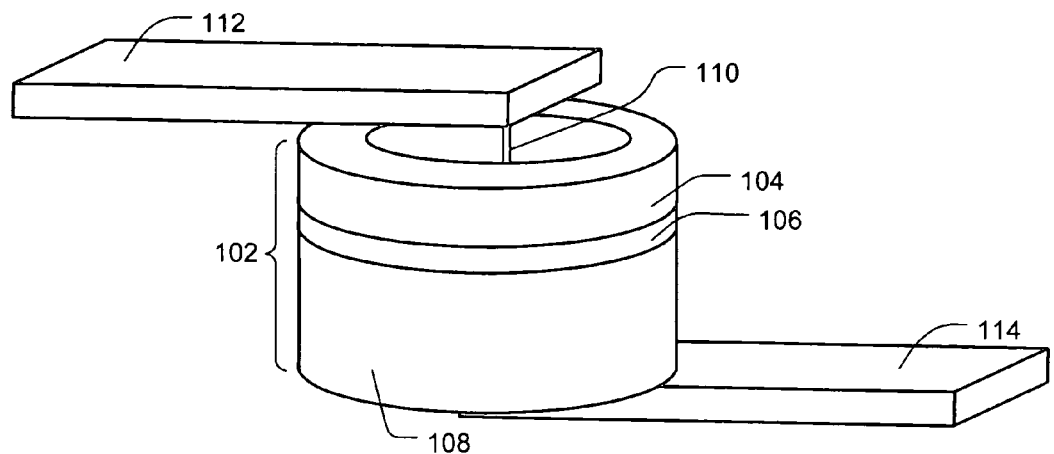
FIG. 1 provides a projection view of a simplified memory cell.

In an exemplary embodiment, a memory cell has a ring-shaped magnetoresistive element (or bit) configured with a word line threaded through a center hole in the ring-shaped element. FIG. 1 provides a perspective view of a simplified memory cell. A ring-shaped multilayer magnetoresistive element 102 is shown having three ring layers stacked vertically. Two ferromagnetic ring layers, 104 and 108, sandwich a nonmagnetic spacer layer 106 (typically copper for GMR or alumina $Al_2O_3$ for MTJ). A via 110 is positioned within a center hole (or aperture) of the ring-shaped element 102 and extends vertically from the top of the element 102 to the base of the ring-shaped element 102. A top write-read line 112 is coupled with the top of the via 110. The top write-read line 112 extends radially from the center hole past the curved perimeter of the ring-shaped element 102. Likewise, a base write-read line 114 is coupled with the base of the via 110. The top write-read line 114 extends radially from the center hole past the curved perimeter of the ring-shaped element 102.

Each of the ferromagnetic ring layers, 104 and 108, have an associated magnetization direction. According to an embodiment, the magnetization directions of the ferromagnetic ring layers 104 and 108 are bi-stable, and are directed in either a clockwise or counterclockwise direction about the center hole of the ring-shaped element. The bi-stable magnetization directions follow what is known as the "easy-axis" of the element. The corresponding "hard-axis" refers to magnetization directions that are either radially-inward or radially outward. According to a preferred embodiment, "hard axis" magnetization directions are not stable—although the magnetization direction of an element may temporarily point along the hard-axis during a switching process. Also, according to a preferred embodiment, the word lines exert the bulk of magnetic fields applied to the element in the easy-axis direction (and not in the hard-axis direction). However, it is recognized that additional word lines may be added to apply hard-axis fields to aid in state switching.

Figure 2A:
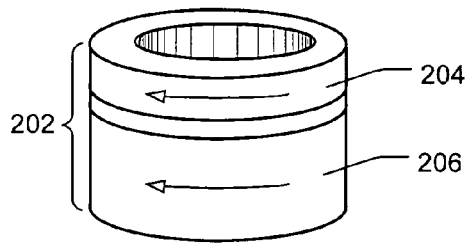
FIG. 2(a) provides a projection view of a ring-shaped memory element having parallel magnetization directions.
Figure 2B:
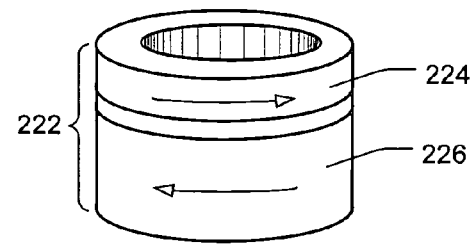
FIG. 2(b) provides a projection view of a ring-shaped memory element having anti-parallel magnetization directions.

The relative orientation of the magnetization directions are shown in FIGS. 2(a) and 2(b). FIG. 2(a) shows a tri-layer ring-shaped element 202 with two ferromagnetic layers 204 and 206. As indicated by the two arrows, the magnetization directions of ferromagnetic layers 204 and 206 have the same orientation (to the left; or clockwise from a top-view). Because the magnetization directions of the ferromagnetic layers 204 and 206 have the same orientation, they are said to be parallel. FIG. 2(b) shows a tri-layer ring-shaped element 222 having two ferromagnetic layers 224 and 226. Because the magnetization directions of the ferromagnetic layers 224 and 226 are in opposite directions, they are said to be anti-parallel. The relative orientation of the magnetization directions alters the resistance across a magnetoresistive element (top to bottom). Thus, when the magnetization directions are parallel (as shown by FIG. 2(a)), resistance to a current applied perpendicularly through the layers of the ring-shaped element 202 is at a minimum. Conversely, when the magnetization directions are anti-parallel (as shown by FIG. 2(b)), resistance across the ring shaped element 222 is at a maximum.

The memory element is useful for storing binary information. At a physical level, information is coded according to the relative magnetization directions of the ferromagnetic layers of the element. For example, in an embodiment, a ring-shaped spin-valve element is a type of ring-shaped magnetoresistive element and has two ferromagnetic layers: a free layer and a fixed or pinned layer. The two ferromagnetic layers are separated by a nonmagnetic conducting layer (such as copper for GMR or $Al_2O_3$ for MTJ). The magnetization direction of the free layer is switched by the memory device according to the binary value to be stored in the element. The fixed layer, however, has a permanent magnetization direction and serves as a reference. When the magnetization directions of the free and fixed layers are parallel, resistance across the element is minimum—thus, reflecting a binary value of "0". Likewise, when the magnetization directions of the free and fixed layers are anti-parallel, resistance across the element is maximum—thus reflecting a binary value of "1". One skilled in the art will recognize that the selection of "0" and "1" is arbitrary and could be reversed or otherwise altered without impairing functionality.

Figure 3:
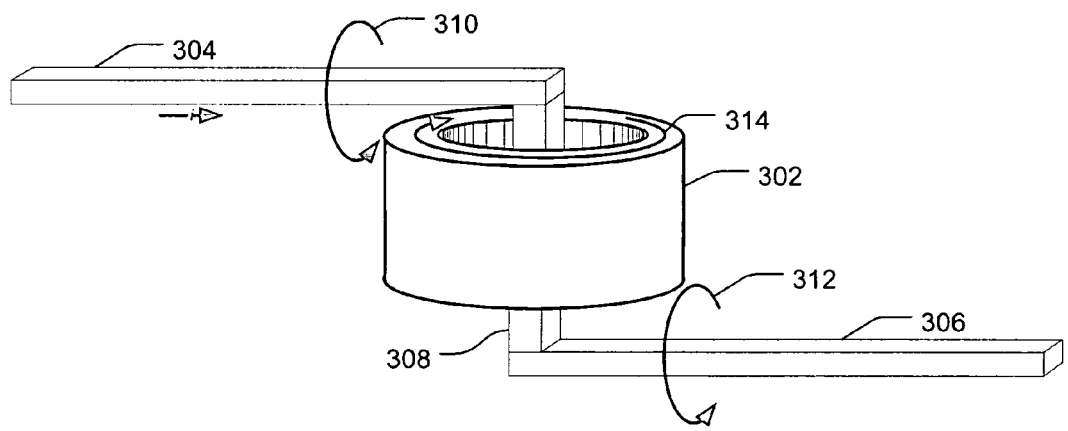
FIG. 3 provides a projection view of a simplified memory cell showing applied magnetic fields.

Magnetic fields created by a current i passing through a word line are shown in FIG. 3. A ring-shaped magnetoresistive element 302 is shown with a write-read line threaded through the center hole of the ring-shaped element 302. (For simplicity, the layers of the element have not been shown.) The write-read line is made up of three segments: a top write-read line 304 passing near the top of the ring-shaped element 302, a base write-read line 306 passing near the base of the ring-shaped element 302, and a via 308 passing through the center hole of the ring-shaped element 302. A current i is shown passing from left to right through the write-read line. A current passing through a wire (such as the write-read line) will create a magnetic field acting circumferentially to the flow of current according to the right-hand rule of electromagnetism. (I.e., if the thumb points in the direction of current, then the fingers curl in the direction of the magnetic field).

Magnetic fields created by the current i are shown for each segment of the write-read line. A first magnetic field 310 is shown looping around the top write-read line 304. The first magnetic field 310 acts on the left side of the ring-shaped element 302 to promote a clockwise (as seen from the top) magnetization direction of the ferromagnetic layers of the ring-shaped element 302. A second magnetic field 312 is shown looping around the base word line 306. The second magnetic field 312 acts on the right side of the ring-shaped element 302 to promote a clockwise magnetization direction of the ferromagnetic layers of the ring-shaped element 302. A third magnetic field 314 is shown looping around the via 308. The third magnetic field acts on the ring-shaped element 302 to promote a clockwise magnetization direction of ferromagnetic layers of the ring-shaped element 302.

As one skilled in the art will readily recognize, if the direction of current i is reversed, the direction of each of the magnetic fields 310, 312, and 314 will also reverse. In addition, the strength of the magnetic fields 310, 312, and 314 increases as the magnitude of current i increases. Thus, a larger current i may be required to switch the magnetization direction of a ferromagnetic layer with a high coercivity than would be required to switch the magnetization direction of a ferromagnetic layer with a low coercivity. Generally, control circuitry connected with the word line will control the direction and magnitude of current i.

2. Exemplary Ring-Shaped Memory Element

A ring-shaped memory element can be represented by various embodiments. For example, a ring-shaped spin-valve (SV) element has been briefly described above.

A SV bit (element) may be configured with at least one pinned magnetic layer and at least one free magnetic layer. Data may be stored in the free layer(s). Typically, the pinned magnetic layer is pinned with platinum manganese (PtMn) although other materials are available. The spin-valve bit can be configured as a GMR device or an MTJ device. Additionally, the SV bit can be read using only the bit sense lines during a read operation.

A. Ring-Shaped Pseudo spin-valve

Another exemplary ring-shaped element is a ring-shaped pseudo spin-valve. The ring-shaped element shown in FIG. 2(b) can be used to describe the pseudo spin-valve. In FIG. 2(b), a ring-shaped pseudo spin-valve 222 has two ferromagnetic layers 224, 226 that sandwich a nonmagnetic spacer layer (typically copper for GMR or $Al_2O_3$ for MTJ—although other materials are available).

Unlike the spin-valve, the pseudo spin-valve 222 does not have a fixed layer. Rather, the pseudo spin-valve 222 has at least two ferromagnetic layers 224, 226 that are substantially free to switch their magnetization directions. One of the ferromagnetic layers is termed a sense layer 224, while the other ferromagnetic layer is termed a storage layer 226. In FIG. 2(b), the storage layer 226 is shown as thicker than the sense layer 224. This difference in thickness is indicative of a difference in coercivity of the two ferromagnetic layers. Because of this difference in coercivity, a stronger magnetic field is required to switch the magnetization direction of the storage layer 226 than is required to switch the magnetization direction of the sense layer 224. One skilled in the art will recognize that the difference in coercivity may be achieved through various means such as, for example, geometric differences (i.e., making one layer thicker or larger), altering the ferromagnetic material (i.e., doping with cobalt, for instance), or magnetic hardening.

In operation, a large magnetic field is applied to the pseudo spin-valve 222 for setting the magnetization direction of the storage layer 226 during a write sequence. During a read sequence, however, a smaller magnetic field is applied to the pseudo spin-valve 222 for switching the magnetization direction of the sense layer 224 without switching the magnetization direction of the storage layer 226. Thus, during a read sequence, the known magnetization direction of the sense layer 224 is used to interrogate the magnetization direction of the storage layer 226.

B. Ring-Shaped Magnetic Tunnel Junction

Another type of ring-shaped magnetoresistive element is a ring-shaped magnetic tunnel junction (MTJ) that makes use of the tunneling magnetoresistive effect to store binary information. MTJ's are favored because they can provide a high magnetoresistive ratio compared with other magnetic memory elements.

In an embodiment, the MTJ has a nonmagnetic tunnel junction layer sandwiched between two ferromagnetic layers. In a typical SV arrangement, one of the magnetic layers is configured to be a fixed layer. An anti-ferromagnetic layer (e.g. platinum manganese PtMn) may be useful in fixing the magnetization direction of the fixed layer. In practice the fixed layer may alternatively be designed with a high coercivity. Thus, the fixed layer is treated substantially like a permanent magnet with a permanent direction. A second magnetic layer is termed a free layer. The free layer is configured to switch its magnetization direction in response to a externally applied magnetic field of sufficient strength. As an example, in FIG. 1, the ring-shaped multilayer magnetoresistive element may be a MTJ if the nonmagnetic spacer layer 106 were a nonmagnetic tunnel junction layer.

In order to store binary data, the MTJ has two possible logical states (i.e. binary states). These states are often referred to as "1" and "0." The state of the MTJ is defined by whether the magnetization directions of the two magnetic layers are parallel or anti-parallel.

The tunneling magnetoresistive effect is based on the phenomenon that an applied magnetic field can influence the resistivity of a material. In simple terms, the resistance to a current passing through the MTJ is "high" when the magnetization directions of the magnetic layers are anti-parallel and "low" when the magnetization directions are parallel. Usually, the resistivity of an MTJ is determined by applying a read voltage and measuring a read current passed perpendicularly (vertically) through each layer of the MTJ.

According to an embodiment, the barrier layer is an aluminum oxide ($AlO_2$) ring-shaped layer that is grown to approximately 10 angstroms thick. Care should be taken to ensure that no holes exist in the barrier layer. Other embodiments of the barrier layer may also be used.

One measure for the quality of an MTJ is its magnetoresistive ratio defined as ($\Delta R/R_{min}$). $\Delta R$ is defined as the difference between the resistivity of the MTJ when the magnetization directions are anti-parallel and the resistivity of the MTJ when the magnetization directions are parallel, while $R_{min}$ is the resistivity of the MTJ when the magnetization directions are parallel (minimum resistivity). According to an embodiment, a magnetoresistive ratio of 40% or more can be achieved in a ring-shaped MTJ.

An alternative ring-shaped element, termed a ring-shaped pseudo spin-valve (PSV) magnetic tunnel junction (MTJ) element, is proposed that has the write/read functionality of a pseudo spin-valve (PSV) giant magnetoresistive (GMR) element, but has a tunneling barrier separating the two ferromagnetic layers. Thus, a nonmagnetic tunnel junction layer is sandwiched between a ferromagnetic sense layer and a ferromagnetic storage layer. The two ferromagnetic layers are configured such that the storage layer has a higher coercivity than the sense layer. The magnetization direction of the storage layer is indicative of the logical state of the ring-shaped element. The magnetization direction of the sense layer is switched during a read sequence and used to interrogate the storage layer in order to determine the magnetization direction of the storage layer.

As one skilled in the art will understand, other layers, such as caps, etch stops, anti-ferromagnetic layers, conductors, etc., may be added to the stack of any of the described ring-shaped element types. Generally, the ring-shaped magnetoresistive element is considered to have a cylindrical shape with a hollow center hole. However, the shape is not restricted to strictly interpreted geometric cylindrical embodiments. For example, a toroidally shaped magnetoresistive element is also proposed. (A toroid is just a short cylinder with a hole in the center. For example, a doughnut may be described as a toroid.)

In another embodiment, the outside diameter of the ring shaped element is approximately 0.5 micrometers. (Other sizes may be also used). Although not critical, care should be taken to ensure that each ring-shaped element in a memory device is approximately the same size and shape. This uniformity aids in reliability and simplicity of associated write/read functionality.

In yet another embodiment, a plurality of ferromagnetic ring layers are separated by nonmagnetic spacer layers. Each ferromagnetic ring layer has a bi-stable magnetic configuration. In other words, a magnetization direction within each ferromagnetic layer is stable in both (but only one at a time) a clockwise direction around the center hole of the element and a counterclockwise direction around the hole. Resistance across the element is at a minimum when the magnetization directions of the ferromagnetic layers are in a parallel orientation, and resistance is at a maximum when the magnetization directions of the ferromagnetic layers are anti-parallel.

3. Exemplary Memory Cell

Figure 4:
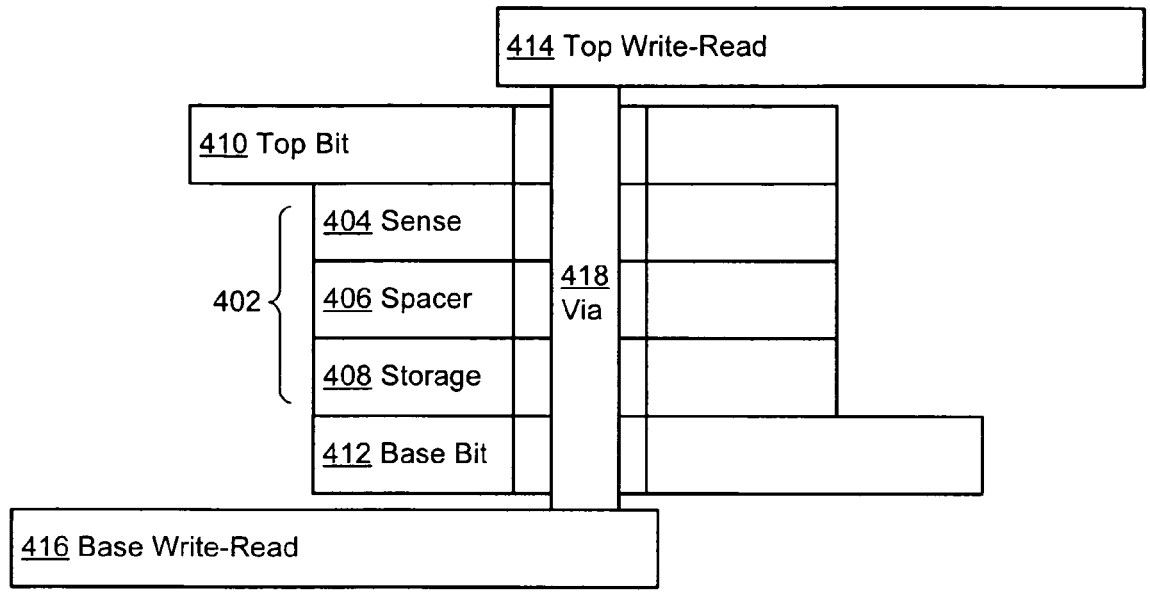
FIG. 4 is a cross-sectional view of a memory cell showing write-read connections.

According to an embodiment, a memory array is made up of many rows and columns. At the intersection of each row and column lies a memory cell. The memory cell contains a ring-shaped memory element along with write-read circuitry (e.g. a read select transistor). FIG. 4 provides a cross-sectional view of a simplified memory cell. A ring-shaped magnetoresistive memory element 402 is shown as a tri-layer device having a PSV sense layer 404, a spacer layer 406, and a storage layer 408. The sense layer 404 and storage layer 408 are both magnetic (ferromagnetic) layers each having a magnetization direction. The spacer layer is a nonmagnetic spacer. Coupled with the sense layer 404 is a top bit sense line 410. Likewise, a base bit sense line 412 is coupled with the storage layer 408. The two bit sense lines 410, 412 are configured to create a voltage difference across the ring-shaped element 402 for determining a top-bottom resistance across the element 402.

A top write-read line 414 is configured near the top bit sense line 410 and is electrically isolated from the ring-shaped element 402 and from the top bit sense line 410. A base write-read line 416 is configured near the base bit sense line 412 and is electrically isolated from the ring shaped element 402 and from the base bit sense line 412. A via 418 passes through a center hole in the ring-shaped element 402 and electrically interconnects the top write-read line 414 with the base write-read line 416. The via 418 is also electrically isolated from the ring-shaped element 402 and from the top and base bit sense lines 410, 412. An inner wall of the layers is used to indicate isolation between the via 418 and ring-shaped element 402 and the top and base bit sense lines 410, 412.

Additional control circuitry (not shown) is used to control current flow and voltage in the write-read lines and bit sense lines. In the bit sense lines, for example, a voltage difference may be created across the layers of the ring-shaped element 402 by coupling the top bit sense line 410 with a power source and coupling the base bit sense line 412 with a ground. The voltage difference may be triggered by, for example, a switch, such as a transistor, interconnected between the base bit sense line 412 and the ground. The voltage difference is applied in order to determine whether the resistance across the ring-shaped element 402 is "high" or "low." This binary state of the resistance is indicative of data stored in the ring-shaped element. (Although in the case of a pseudo spin-valve, two readings may be required to determine the value of the data—one before and one after switching the magnetization direction of the sense layer.) As one skilled in the art will understand, an assortment of control and latching schemes are available for obtaining an indication of the resistance across the ring-shaped element 402. According to certain terminology, a bit sense line comprises the pathway from the top bit sense line 410 through the ring-shaped element 402 to the base bit sense line 412.

The write-read lines 414, 416 are arranged near the ring-shaped element 402 such that a current passing through the write-read lines 414, 416 generates magnetic fields that act on the ring-shaped element 402 for switching the magnetization direction of at least one of the magnetic layers 404, 408. In one embodiment, current passing through the via 418 also creates a magnetic field for switching the magnetization direction of at least one of the magnetic layers 404, 408. According to another embodiment, the magnetic fields created at the via 418 are negligible. In a further embodiment, a current passed across the ring-shaped element 402 from the top bit sense line 410 to the base bit sense line 412 for switching the magnetization direction of at least one of the magnetic layers 404, 408.

In an alternative embodiment, ring-shaped magnetoresistive memory element 402 is a tri-layer device having a SV storage layer 404, a tunnel layer 406, and a SV pinned layer 408. The SV storage layer 404 and SV pinned layer 408 are both magnetic (ferromagnetic) layers each having a magnetization direction. The spacer layer is a nonmagnetic tunnel. Coupled with the SV storage layer 404 is a top bit sense line 410. Likewise, a base bit sense line 412 is coupled with the SV pinned layer 408. The two bit sense lines 410, 412 are configured to create a voltage difference across the ring-shaped element 402 for determining a top-bottom resistance across the element 402.

FIGS. 4 (and 5) provide embodiments as an illustration of a configuration of a memory cell and should be seen as instructive rather than limiting. For example, it will be understood that the PSV sense/SV storage layer 404 and PSV storage/SV pinned layer 408 may be switched with one another or replaced with free and pinned layers. Additionally, the top bit sense line 410 is interchangeable with the base bit sense line 412. Generally, the base is understood to be closer to the substrate or circuit board foundation than the top. However, one skilled in the art will understand that the order of the stack can be inverted without substantial problems.

Figure 5:
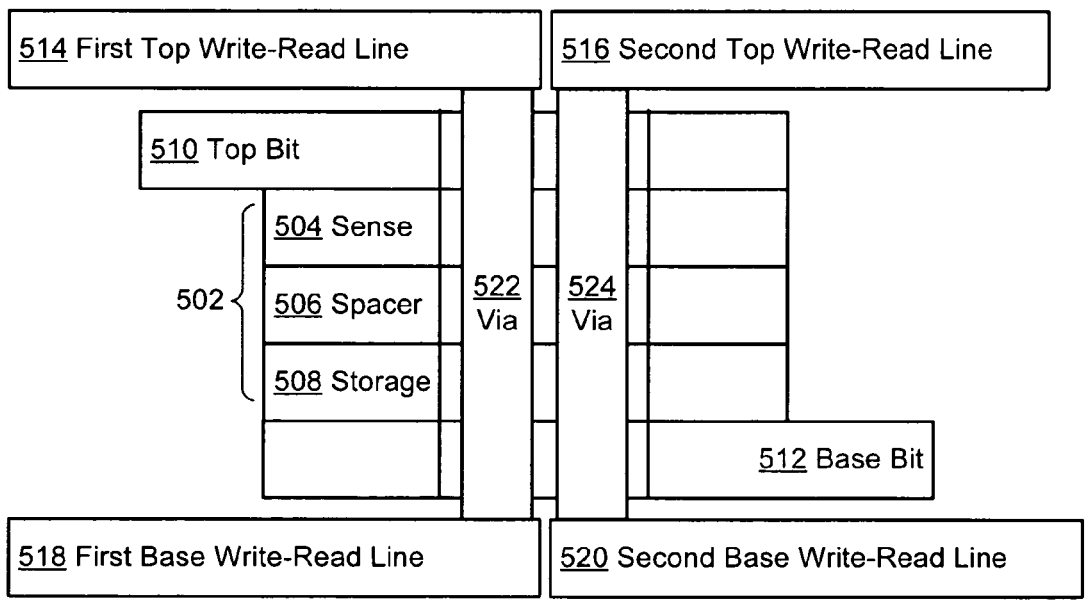
FIG. 5 is a second cross-sectional view of a simplified memory cell showing write-read connections.

FIG. 5 is a cross-sectional view of a memory cell having multiple word lines threaded through a ring-shaped element. A ring-shaped element 502 is shown as a tri-layer device having a nonmagnetic spacer layer 506 sandwiched between a ferromagnetic sense layer 504 and a ferromagnetic storage layer 508. Other types of ring-shaped elements may also be used—such as those with more than two ferromagnetic layers. A bit sense line passes from a top bit sense line 510 through the ring-shaped element 502 to the base bit sense line 512.

A pair of write-read lines (x-axis write-read line and y-axis write-read line) is shown threaded through the center hole of the ring-shaped element 502. A top x-axis write-read line 514 is arranged near the top bit sense line 510 and coupled with a first via 522 that passes through the center hole. The first via 522 is also coupled with a base x-axis write-read line 518 arranged near the base bit sense line 512. A top y-axis write-read line 516 is arranged near the top bit sense line 510 and coupled with a second via 524 that passes through the center hole. The second via 524 is also coupled with a base y-axis write-read line 520 arranged near the base bit sense line 512. The write-read lines are arranged to extend radially from their via coupling points past the perimeter of the ring-shaped element. According to a preferred embodiment, the write-read lines are made of aluminum, although other conductors are applicable such as, nickel iron (NiFe), clad gold and copper, for instance. One skilled in the art will recognize that various materials are available for construction of the write-read lines and other features of the embodiments. According to an embodiment, each write-read line is electrically isolated from the ring-shaped element 502 and from top and base bit sense lines 510, 512 by, for example, a silicon dioxide ($SiO_2$) coating or layer. In addition, each write-read line may be electrically isolated from the other write-read lines (at least in the region of the memory cell).

In operation, a current is passed through both the x-axis and y-axis write-read lines to create a combined magnetic field that acts to switch the magnetization direction of at least one of the ferromagnetic layers of the ring-shaped element. According to one embodiment, a switching sequence of the sense layer involves passing a current through only the x-axis write-read line, and a switching sequence of the storage layer involves passing a current through both the x-axis and y-axis write-read lines. As can be understood from the diagram, the x-axis and y-axis word lines can be interchanged without altering functionality of the memory cell.

Figure 6:
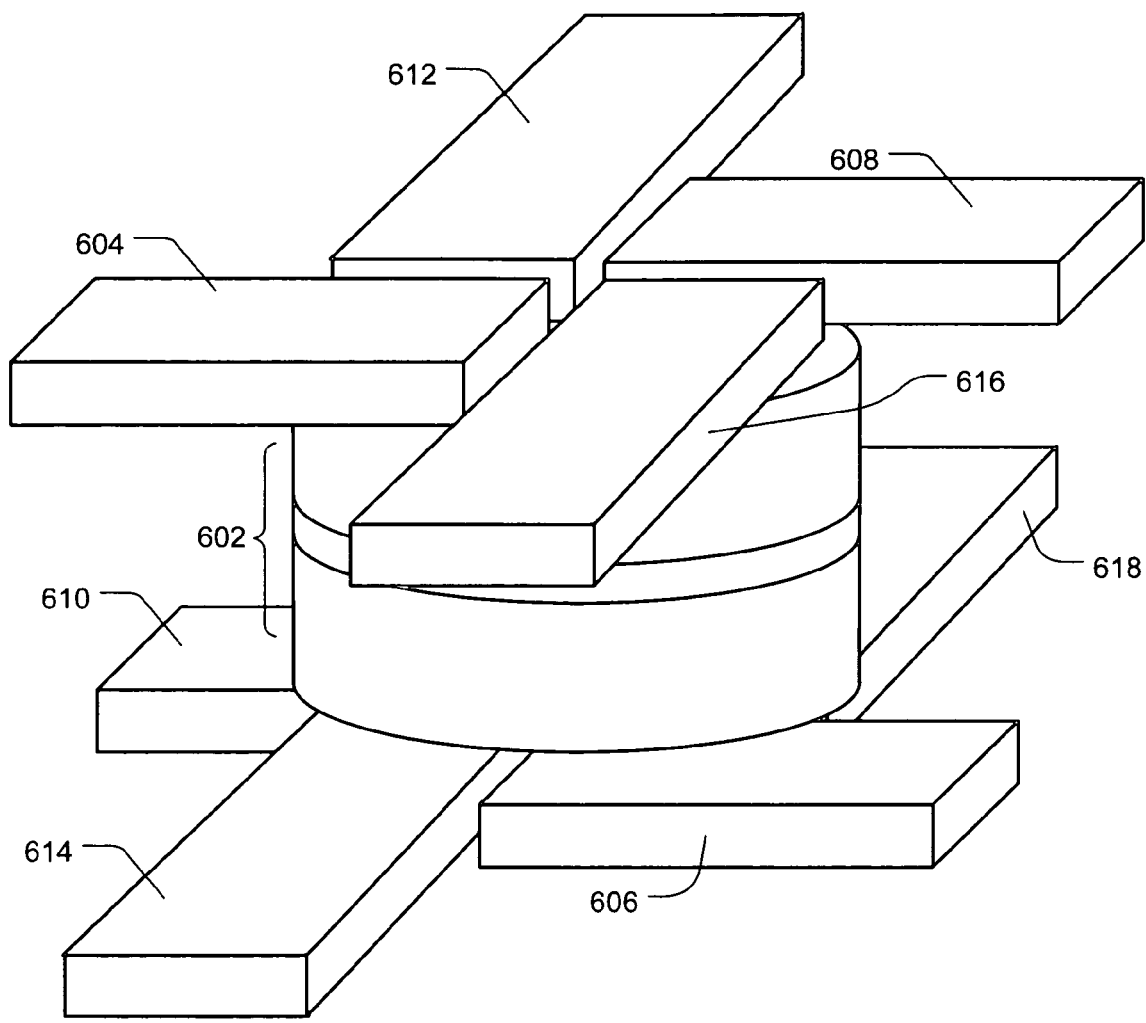
FIG. 6 provides a projection view of a simplified memory cell showing a memory element and multiple write-read lines (vias not shown).

FIG. 6 is a simplified memory cell showing multiple write-read lines for applying magnetic fields to a ring-shaped memory element 602. The $x_1$-top write-read line 604 passes radially over a quadrant of the ring-shaped element 602 and is connected with $x_1$-base write-read line 606 through a first via (not shown) that passes through a center hole in the ring-shaped memory element 602. The $x_1$-base word line 606 passes radially under a quadrant of the ring-shaped element 602.

An $x_2$-top write-read line 608 is connected with $x_2$-base write-line line 610 through a second via (not shown) that passes through the center hole in the ring-shaped element 602. A $y_1$-top write-read line 612 is connected with $y_1$-base write-read line 614 through a third via (not shown) that passes through the center hole. A $y_2$-top write-read line 616 is connected with $y_2$-base write-read line 618 through a fourth via (not shown) that passes through the center hole in the ring-shaped element 602. Each write-read line 604, 606, 608, 610, 612, 614, 616 & 618 passes radially near a quadrant of the ring shaped element 602 and is configured to generate a magnetic field for switching at least one magnetic layer of the ring-shaped element 602.

Figure 7C:
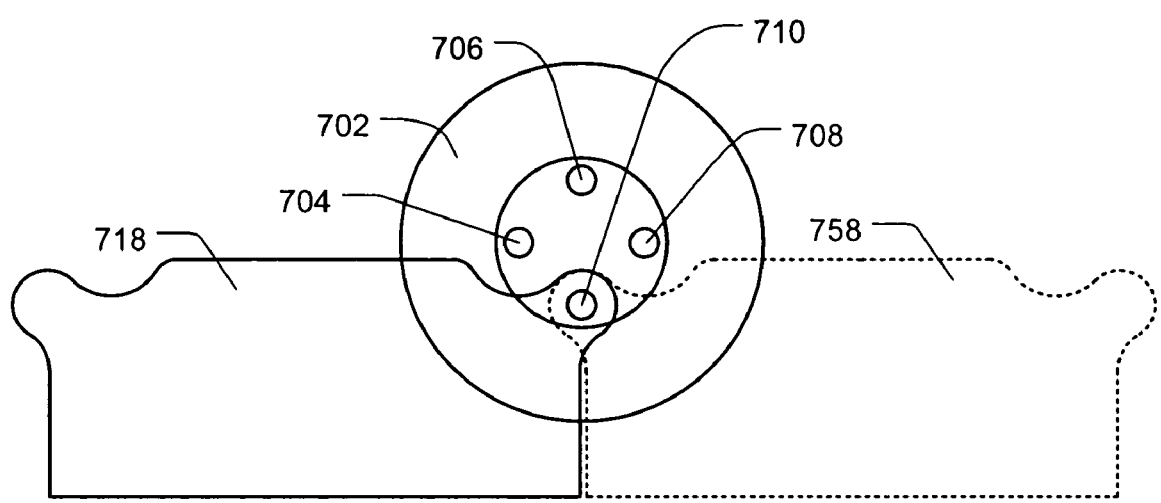
FIG. 7(c) is a partial combined top view of an embodiment of a memory cell showing a memory element, four center vias, a top write-read line and a base write-read line.

FIG. 7(a)–(c) provide various views of an arrangement of write-read lines in a memory cell according to another embodiment. In FIG. 7(a), a top view of a memory cell is shown having four top write-read traces. A ring shaped magnetoresistive memory element 702 has an inner circumference that defines a center hole and has an outside perimeter. Four vias 704, 706, 708 & 710 are arranged within the center hole. According to an embodiment, each via is located within a separate quadrant of the center hole and electrically isolated from the other vias, the ring-shaped element 702 and top and base bit sense lines (not shown). Four top write-read traces 712, 714, 716 & 718 each pass over a quadrant of the ring-shaped element 702 and couple with one of the four vias 704, 706, 708 & 710. A first y-axis top write-read trace 712 is coupled with a top end of a first via 704. A first x-axis top write-read trace 714 is coupled with a top end of a second via 706. A second y-axis top write-read trace 716 is coupled with a top end of a third via 708. A second x-axis top write-read trace 718 is coupled with a top end of a fourth via 710.

As shown in FIG. 7(a), the top write-read traces 712, 714, 716 & 718 have a flange that extends over the center hole of the ring-shaped element 702 to couple with the associated via. The top write-read traces 712, 714, 716 & 718 expand as they extend radially from the center hole over the perimeter of the ring-shaped element 702. According to an embodiment, the narrowed portion of the top write-read traces 712, 714, 716 & 718 that passes over the ring-shaped element 702 is useful for generating a more concentrated magnetic field for switching a logical state of the ring-shaped element 702. In a similar embodiment, the width of the write-read traces increases as the trace extends from the via toward the perimeter.

In an exemplary operation of the memory cell, a radial current is passed through each top trace 712, 714, 716 & 718 (i.e. current flowing from the vias to the top traces and radially outward over the perimeter). The radial-outward flowing currents create magnetic fields that act on the ring-shaped element 702 in a counterclockwise direction (as seen from the top) around the center hole. Likewise, a radial-inward current (i.e. current flowing from the perimeter toward the center hole) will produce magnetic fields acting on the ring-shaped element 702 in a clockwise direction (as seen from the top) around the center hole.

FIG. 7(b) shows a top view of the memory cell. Four base write-read traces 752, 754, 756 & 758 are configured under the ring-shaped element 702. A first y-axis base write-read trace 752 is coupled with a base end of the first via 704. A first x-axis base write-read trace 754 is coupled with a base end of the second via 706. A second y-axis base write-read trace 756 is coupled with a base end of the third via 708. A second x-axis base write-read trace 758 is coupled with a base end of the fourth via 710. According to the present embodiment, the base write-read traces have a similar shape as top trace embodiments. However, one skilled in the art will understand that differences may exist in shape, size, and composition.

In an exemplary operation of the memory cell, a radial-outward current is passed through each base write-read trace 752, 754, 756 & 758 (i.e. current flowing from the vias to the base write-read traces and radially under the perimeter). The radial-outward flowing currents create magnetic fields that act on the ring-shaped element 702 in a clockwise direction (as seen from the top) around the center hole. Likewise, a radial-inward current (i.e. current flowing from the perimeter toward the center hole) will produce magnetic fields acting on the ring-shaped element 702 in a counterclockwise direction (as seen from the top) around the center hole.

Because both top write-read traces 712, 714, 716 & 718 and base write-read traces 752, 754, 756 & 758 are coupled with vias 704, 706, 708 & 710, each top write-read trace 712, 714, 716 & 718 has an associated base write-read trace 752, 754, 756 & 758. Thus, first y-axis top write-read trace 712 is electrically connected with first y-axis base write-read trace 752. First x-axis top write-read trace 714 is electrically connected with first x-axis base write-read trace 754. Second y-axis top write-read trace 716 is electrically connected with second y-axis base write-read trace 756. And, second x-axis top write-read trace 718 is electrically connected with second x-axis base write-read trace 758.

FIG. 7(c) is a partial combined top view of the memory cell showing only a single connection between a x-axis top write-read trace and a x-axis base write-read trace. The second x-axis top write-read trace 718 is shown connected with the top of the fourth via 710. The second x-axis base write-read trace 758 is shown connected with the base of the fourth via 710. The second x-axis base write-read trace 758 is outlined with a dashed line to indicate that it is a base write-read trace rather than a top write-read trace. It can be noted that the connection shown begins with the second x-axis top write-read trace 718 at the left of the drawing and ends with the second x-axis base write-read trace 758 at the right of the drawing. Although not necessary, this layout is useful in the organization of the memory array. It will be understood by one skilled in the art that the top-base connection shown in FIG. 7(c) can be formed through any of the vias and between any two traces so long as one write-read trace is a top trace and the other write-read trace is a base trace.

Several embodiments of the memory cell have been shown. Yet these embodiments are merely meant to illustrate general organization. Other embodiments are also contemplated. For example, any of the ring-shaped elements mentioned in section two may also be incorporated into a memory cell embodiment. Likewise, any number of write-read lines may be configured to pass near the ring-shaped element. For example six or eight or nine write-read lines may be configured to thread each ring-shaped element. Each write-read line adds complexity but allows a lower threshold current to be used for switching.

4. Exemplary Construction

Again looking at FIG. 4, the steps of manufacturing of an embodiment of a magnetoresistive memory cell tunneling are described below. Beginning with a seed layer (not shown) such as Ta, a base write-read line 416 is deposited on the substrate and patterned. After an insulating layer is deposited on the base write-read line 416, a ring-shaped base bit sense line 412 is deposited and patterned for connecting a ground (not shown) with a ring-shaped storage layer 408. The ring-shaped storage layer 408 is deposited and patterned on the base bit sense line 412, and a spacer layer 406 grown upon the storage layer 408 and patterned. A sense layer 404 is deposited and patterned above the spacer layer 406. A top bit sense line 410 is deposited on the sense layer 404 and patterned. After an insulating layer is deposited on the top bit sense line 410 and patterned, a top write-read line 414 is deposited and patterned. A via 418 passes through the center hole of the layers and interconnects the two write-read lines 414, 416.

According to the preferred embodiment, all depositions are made across an entire silicon wafer and patterning is by a mask and etch process. Further, or alternatively, a cap layer (not shown), such as of Ta, may also be provided as well as an etch stop such as CrSi or TiN.

A magnetic layer of the element may be designed as a single layer, a bilayer, or a multilayer. A single layer, for example, may be constructed of nickel-iron (NiFe) or nickel-iron-cobalt (NiFeCo). Alternatively, a bilayer, such as NiFe/CoFe may be used. More generally, a multilayer of various ferrous alloys may be used (a bilayer is a form of multilayer). The device may be grown by sputtering, ion beam deposition, plasma vapor deposition, evaporation, or epitaxially, for example. Patterning can be by wet chemical etching, dry etching, ion milling, or reactive etching, for example. These steps of manufacturing a cell are meant to provide a general illustration of a single process for an embodiment. One skilled in the art will recognize that many other manufacturing processes may be used to produce a memory cell or a memory array. Thus, these manufacturing steps should not be applied to limit the scope of the invention as claimed.

A standard antiferromagnetic (AF) or synthetic antiferromagnetic (SAF) layer can be used for the pinned layer of SV, GMR, or MTJ bits. According to an embodiment, a standard pinned layer is comprised of a magnetic layer, such as NiFe, adjacent to an antiferromagnetic (AF) layer, such as platinum-mangenese (PtMn). Similarly, a SAF pinned layer has a pair of magnetic layers separated by a a material that promotes strong anti-parallel coupling between magnetic between layers, such as ruthenium (Ru). One advantage of a SAF pinned layer for linear magnetized rectangular bits is that it has little or no net magnetic moment (i.e. stray field) because the magnetic field is substantially closed between the two anti-parallel coupled pinned layers. In the presently described circular magnetic bits, a SAF pinned layer may not any advantage over a standard AF pinned layer.

5. Exemplary Memory Array

According to an embodiment, a memory device comprises multiple memory cells arranged within a memory array. The memory array preferably is arranged in a plurality of rows and columns with a memory cell aligned at the intersection of each row and column. According to an embodiment, rows and columns are said to run along an x-axis and y-axis respectively. Write-read lines are also provided that span the rows and columns and thread through the center hole of ring-shaped magnetoresistive memory elements of the memory cells.

Figure 8:
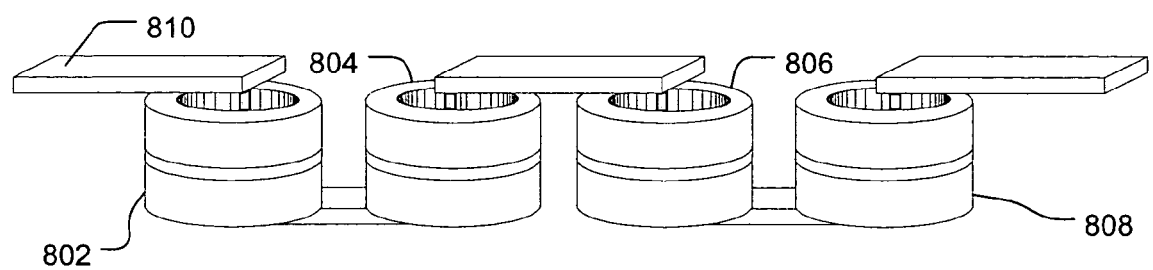
FIG. 8 shows an embodiment of a segment of a row of a simplified memory array having a 2× minimum repeating pattern.

FIG. 8 provides a simplified view of a portion of a row (or column) showing a single write-read line 810 threaded through the center hole of each ring-shaped element 802, 804, 806, 808 in the row. Although the write-read line 810 is aligned near the ring-shaped elements 802, 804, 806, 808, it is electrically isolated from the elements 802, 804, 806, 808 and their sense lines (not shown).

Examining the write-read line 810 from left to right: the write-read line 810 begins above a first ring-shaped element 802 and passes radially inward toward a center hole of the first ring-shaped element 802. The write-read line 810 then passes through the center hole of the first ring-shaped element 802 to the bottom of the first ring-shaped element 802. From the bottom of the center hole of the first ring-shaped element 802, the write-read line 810 passes to a bottom of a center hole of a second ring-shaped element 804 and through the center hole to a top of the second ring-shaped element 804. As shown, the write-read line continues to thread through the remaining third and fourth ring-shaped elements 806, 808, passing top-to-top and bottom-to-bottom.

The top-to-top and bottom-to-bottom pattern exhibited by the write-read line results in a 2x minimum repeating pattern (i.e., the connection pattern repeats at every other memory cell in the row).

Figure 9:
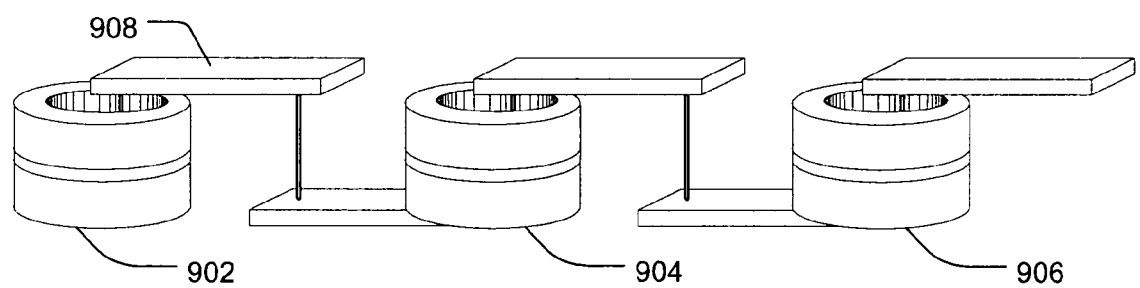
FIG. 9 shows an embodiment of a segment of a row of a simplified memory array having a 1× minimum repeating pattern.

FIG. 9 provides a simplified view of a portion of a row (or column) having a 1x minimum repeating pattern. Three ring-shaped elements (such as SV or PSV GMR or MTJ or other elements) are shown in a row. A write-read line 908 threads through a center hole of each ring-shaped element 902, 904, 906 in a top-to-bottom (or bottom-to-top) repeating pattern. Thus, the write-read line passes from the top of a first ring-shaped element 902 to the bottom of a second ring-shaped element 904. A current passing through the write-read line 908 creates a magnetic field acting on each of the ring-shaped elements 902, 904, 906. In several applications, this embodiment is not be preferred as it may increase the number of vias per write-read line, increase write-read line resistance, and reduces memory density.

Figure 10:
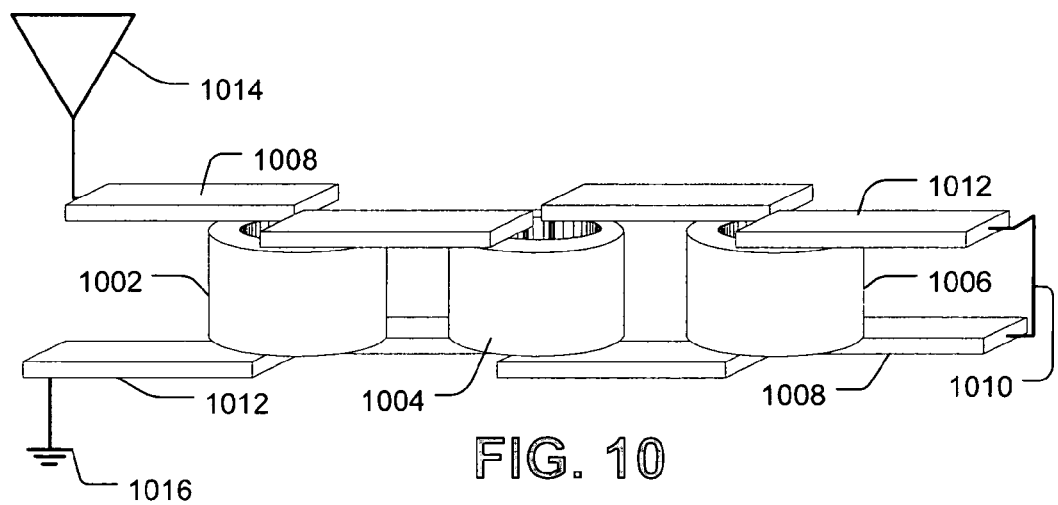
FIG. 10 shows an embodiment of a row of a memory array showing control functionality.

FIG. 10 shows a row of a memory array having a looped write-read line passing twice through each ring-shaped element 1002, 1004, 1006 in the row. The row is shown with three ring-shaped elements 1002, 1004, 1006 for simplicity. It is contemplated that, in operation, many more ring-shaped elements would be incorporated into the row.

A current source 1014 for delivering a current is coupled with a first half write-read line 1008. The first half write-read line 1008 is threaded through the center hole of each ring-shaped element 1002, 1004, 1006 in a top-to-top and bottom-to-bottom pattern. At the end of the row, a loop 1010 couples the first half write-read line 1008 with a second half write-read line 1012. The second half write-read line 1012 is also threaded through the center hole of each ring-shaped element 1002, 1004, 1006 in the top-to-top and bottom-to-bottom pattern. The end of the second half write-read line 1012 is coupled with a ground 1016. Thus, a current path is provided from the current source 1014 to the ground 1016 that passes twice through the center hole of each ring-shaped element in the row. Preferably, the write-read lines 1008, 1012 are arranged such that a current passing through them will create magnetic fields acting on the ring-shaped elements 1002, 1004, 1006 in an additive fashion (i.e. either both acting on an element in a clockwise direction or both acting on an element in a counterclockwise direction as seen from the top).

According to an embodiment, the current source 1014 is configured to generate current in both directions and with at least two magnitudes in order to operate read/write functionality of a ring-shaped pseudo spin-valve (PSV) GMR or MTJ elements. Other elements, such as switches, resistors, etc. have been left out of the drawing for simplicity. One skilled in the art will understand that such devices can be added to the circuit for better control and reliability, for example. Write-read lines associated with columns are not shown in FIG. 10. According to an embodiment, the addition of row write-read lines and column write-read lines would result in at least four lines threaded around each ring-shaped element.

An aspect of some embodiments is that x-axis and y-axis write-read lines are shaped and arranged to provide substantially uniform radial currents and circumferential magnetic fields around each ring-shaped element in both half-select and full-select write/read modes of operation. This uniformity is useful for reliable write/read performance.

Figure 11:
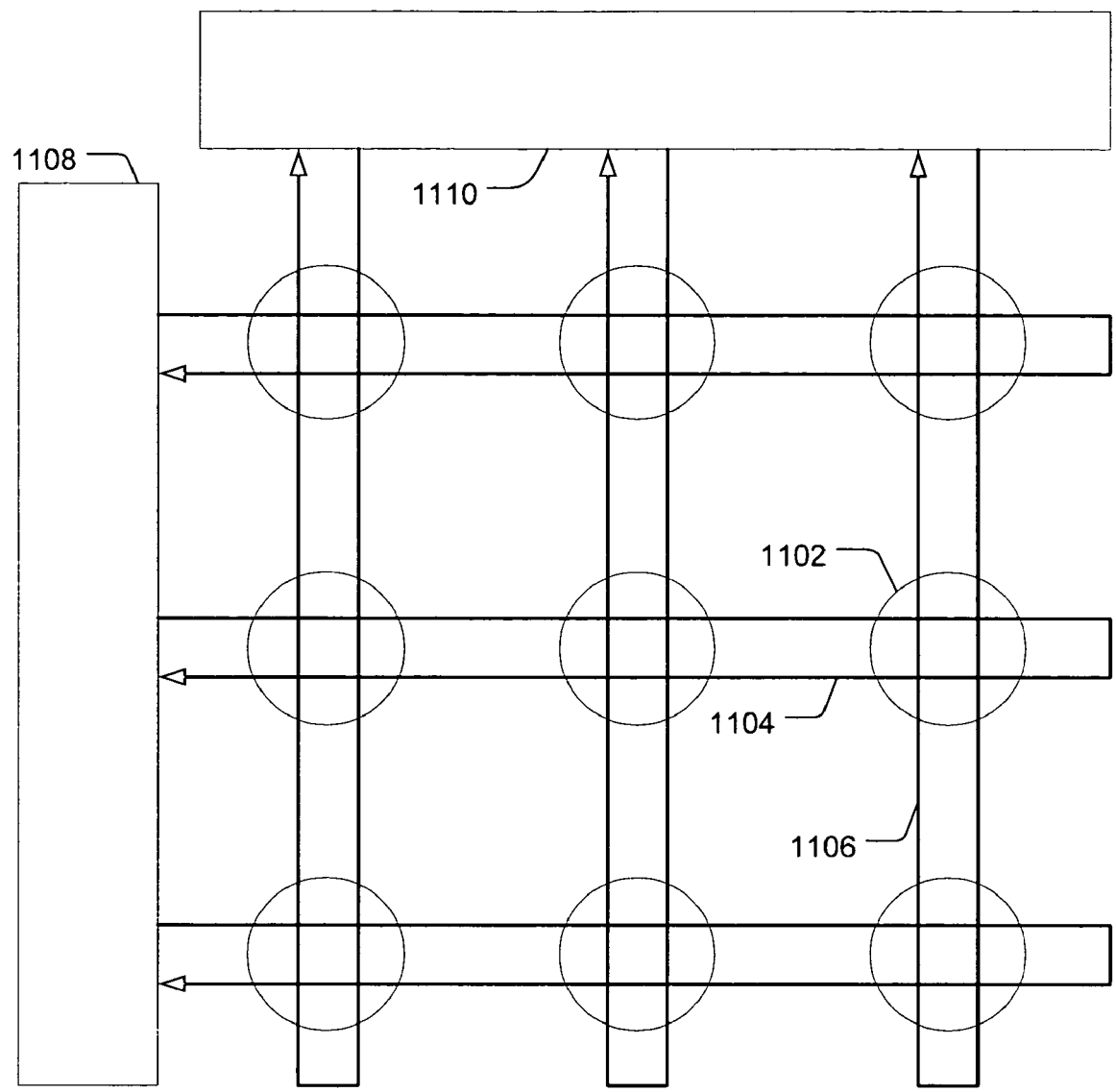
FIG. 11 is a block diagram of an embodiment of a memory array showing control functionality.

FIG. 11 is a block diagram showing a memory array and associated control circuitry. Nine ring-shaped elements are shown as circles in the figure and are arranged in a plurality of rows and columns. For simplification a selected ring-shaped element 1102 will be discussed as an exemplary embodiment of the plurality of ring-shaped elements in the array. Row control circuitry 1108 and column control circuitry 1110 are shown as boxes in the figure and contain switches (such as transistors) for connecting various lines to power supplies, ground, and measurement devices.

Three row write-read lines are shown emitting from the row control circuitry 1108. The row write-read lines pass twice through each associated ring-shape element in a loop that begins and ends at the row control circuitry 1108. A selected row write-read line 1104 is discussed as an exemplary embodiment of the plurality of row write-read lines.

Three column write-read lines are shown emitting from the column control circuitry 1110. The column write-read lines pass twice through each associated ring-shape element in a loop that begins and ends at the column control circuitry 1110. A selected column write-read line 1106 is discussed as an exemplary embodiment of the plurality of column word lines.

According to one embodiment, the row control circuitry 1108 contains a row switch for delivering a row write current and a row drain. Likewise, the column control circuitry 1110 contains a column switch for delivering a column write current and a column drain.

In an exemplary write operation of selected ring-shaped element 1102, currents are passed through both the selected row write-read line 1104 and the selected column write-read line 1106 for generating magnetic fields that act on the ring-shaped elements in the respective selected row and selected column. The row current and column current each create uniform half-select magnetic fields that are individually insufficient to switch the magnetization direction of a storage magnetic layer of the ring-shaped elements. Because both the selected row write-read line 1104 and the selected column write-read line 1106 act on the selected ring-shaped element 1102, a combined magnetic field is created that is sufficient to invert the magnetization direction of a storage layer (or other layer depending upon the type of ring-shaped element).

Application of the row current and column current should be coordinated so that they generate additive magnetic fields rather than fields that cancel one another. Additionally, according to a preferred embodiment, currents may be applied simultaneously or with a minimal delay.

In a further embodiment, during a read sequence of, for example, a ring-shaped pseudo spin-valve (PSV), the magnetization direction of the sense layer of the pseudo spin-valve has a lower coercivity than the storage layer, and thus may be inverted by application of a current through either a row write-read line or through a column write-read line. Thus, the storage layer is configured to invert its magnetization direction in response to a magnetic field of at least a first threshold strength applied on the element, and the sense layer is configured to invert its magnetization direction in response to a magnetic field of at least a second threshold strength applied on the element. Since the coercivity of the storage layer is greater than the sense layer, the first threshold strength is greater than the second threshold strength.

In another embodiment, bit lines are coupled with the control circuitry and coupled with the ring-shaped elements for sensing a quantity indicative of a logical state of the elements. Additionally, the bit sense lines may also be configured to supply additional switching current for generating magnetic fields for switching magnetic layers of the ring-shaped SV or PSV GMR elements.

According to one embodiment, each ring-shaped element is used to store a bit of data without redundancy. For example, a single ring-shaped magnetic tunnel junction element with a minimum resistance of 20K Ohms and a magnetoresistive ratio of 40% may be used as a "solo" element. In an alternative embodiment, several ring-shaped elements are combined to obtain a useable read signal. For example, it may take several ring-shaped GMR elements with a minimum resistance of 50 Ohms and a magnetoresistive ratio of only 5% to obtain a useable read signal. Thus, in a similar embodiment, a redundancy scheme is provided wherein a plurality of elements are used to store a single bit of data. In this embodiment, the bit sense line, may, for example pass through the plurality of elements in series.

Figure 12:
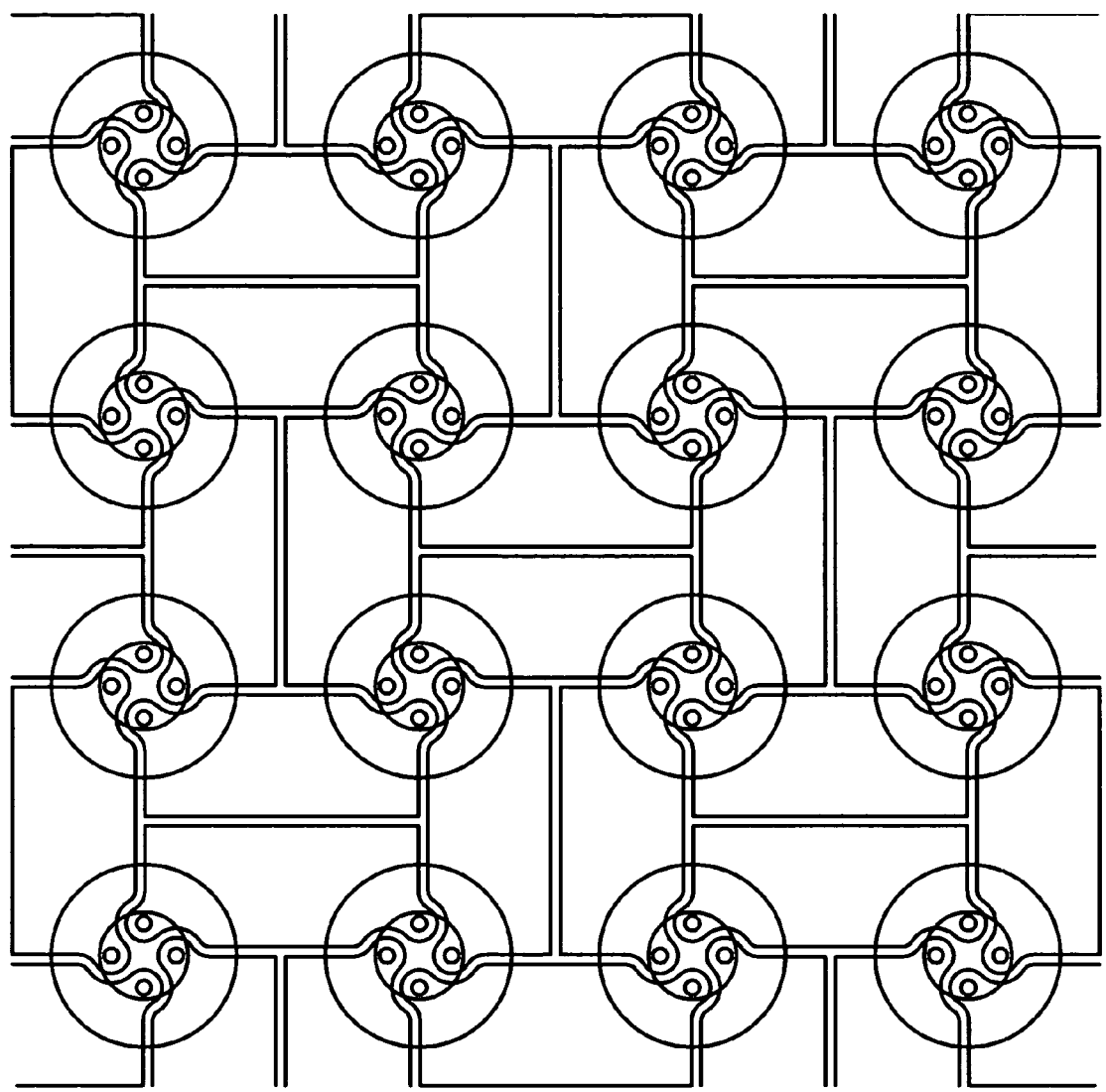
FIG. 12 is a top view of a portion of an embodiment of a memory array showing ring-shaped memory elements, top or bottom write-read lines and center vias.

FIG. 12 is a top view of a portion of a memory array and is an extension of the memory cell shown in FIG. 7(a). Sixteen large circles represent a set of ring-shaped magnetoresistive elements arranged in a plurality of rows and columns. Each ring-shaped element has four vias located within a center hole of the element. Likewise, the top of each via is connected with a top trace that extends either along a write-read row or a column of the array. As can be seen from the figure, the write-read traces are arranged in a repeating pattern with a minimal footprint of four ring-shaped elements.

According to a further embodiment, during setup or during a hard reset, special pads at the periphery of the array may be used to simultaneously set the pinned layers of SV GMR or MTJ elements. Thus, according to this embodiment, a sufficient current is passed through the write-read lines and/or bit sense lines to set the pinned layers. Thus, in an embodiment, the process of setting the pinned layers may include the steps of 1) providing antiferromagnetic or synthetic antiferromagnetic pinning in the bit stack; 2) providing probe pads on x-axis and/or y-axis write-read lines, preferably at edges of element arrays or edges of chips; 3) probing the chip at wafer level or open package level; and 4) simultaneously driving x-axis and/or y-axis write-read lines with external current source. The write currents should be high enough to circumferentially magnetize the pinned layer of all bits in an annealing environment. It is preferred that the write current be passed through both the x-axis and y-axis write-read lines (or, in a more general embodiment, all write-read lines) in order to improve magnetic characteristics that are more uniform.

In an embodiment, this process may be similar to that of setting a permanent magnet and may be used on a spin-valve, giant magnetoresistive device, or magnetic tunnel junction, for example. Other methods and/or apparatus may be provided for setting pinned layers.

A coordinated high current flow may also be used to set or reset other (non-pinned) layers of the elements. The high current flow may also be used to create or alter magnetic bias in the magnetoresistive layers. Further, a coordinated current flow may be used during configuration for testing.

6. Conclusion

A variety of embodiments have been described above. These embodiments, taken as a whole, provide a number of benefits. For instance, the ring-shaped element can substantially eliminate stray magnetic fields and demagnetizing fields. Additionally, the read/write circuitry provided an elegant solution that allows for the use of various types of ring-shaped elements, and eliminates the need for applying radial (hard-axis) magnetic fields to the elements during a switching sequence.

The figures are provided to give a better understanding of several embodiments. The figures, however, are not to scale. The bits and traces are thin film structures with layer thicknesses measured in Angstroms. Those skilled in the art will understand that changes and modifications may be made to these embodiments without departing from the true scope and spirit of the present invention, which is defined by the claims. Features and functionality shown for a single portion of the device may also be implemented when multiple copies of the portion are incorporated in an embodiment. Terms such as left, right, top and bottom have been used to aid in understanding of the invention. Generally, the various embodiments may be wholly or partially inverted or rotated without destroying functionality.

Further, although the invention is described with orthogonal x and y read-write structures, this description is not intended to limit the invention to any specific bit-word memory architecture. The phrase "write-read line" is used throughout the specification. In some situations, this may be equivalent to a "word" line. Additionally, in various architectures, the write-read line is used 1) only for read functionality; or 2) for both write and read functionality. The lines may have other functionality other than those described in the specification such as, for example, bias shifting, current balancing, and reset functionality.

For brevity, information disclosed in one section of this document has not been duplicated in other sections. Therefore, enabling and descriptive disclosure may be found in any section of this document including the background and claims. Additionally, disclosures found in the background section are not intended to be viewed as prior art unless expressly identified as such.

What is claimed is:
1. A magnetoresistive (MR) memory cell comprising:
   a ring-shaped magnetoresistive multilayer element having a base, a top, a hole passing through the center of the element, and a curved surface at the perimeter of the element wherein the ring-shaped magnetoresistive multilayer element comprises a nonmagnetic conducting ring layer sandwiched between a first ferromagnetic layer and a second ferromagnetic layer, and wherein the coercivity of the first layer is greater than the coercivity of the second layer; and at least one write-read line, each write-read line comprising:
- a via passing through the hole, wherein the via is electrically isolated from the element;
- a top write-read line segment arranged near the top and coupled with the via, wherein the top word line extends radially from the via toward the perimeter and wherein the top write-read line is electrically isolated from the element; and
- a base write-read line segment arranged near the base and coupled with the via, wherein the base write-read line extends radially from the via toward the perimeter and wherein the base write-read line is electrically isolated from the element, whereby each write-read line is configured such that a current passing through the write-read line creates a magnetic field for switching a magnetic direction of a layer of the element.

2. The memory cell of claim 1, wherein the ring-shaped magnetoresistive multilayer element comprises:
- an antiferromagnetic ring layer;
- a ferromagnetic pinned ring layer coupled to the antiferromagnetic ring layer;
- a nonmagnetic conducting ring layer coupled to the pinned ring layer; and
- a ferromagnetic free ring layer coupled to the conducting ring layer, whereby a resistance to a current passing perpendicularly through each ring layer is indicative of a logical state of the element.

3. The memory cell of claim 1, wherein the ring-shaped magnetoresistive multilayer element comprises:
- a plurality of ferromagnetic ring layers separated by nonmagnetic spacer ring layers, wherein each ferromagnetic ring layer has a bi-stable magnetic configuration, wherein a magnetization direction associated with each ferromagnetic layer is stable in both a clockwise direction around the hole of the element and a counterclockwise direction around the hole of the element, and
- wherein a resistance across the multilayer element is at a minimum when the magnetization directions associated with the ferromagnetic layers are in a relative parallel orientation, and wherein the resistance is at a maximum when the magnetization directions of the ferromagnetic layers are relatively anti-parallel.

4. The memory cell of claim 1, further comprising:
- a top bit sense line coupled with the top; and
- a base bit sense line coupled with the base,
- wherein a resistance to a current passing through the element from the top bit sense line to the base bit sense line is indicative of a logical state of the multilayer element.

5. The memory cell of claim 1, wherein a width of the top write-read line increases as the top write-read line extends from the via toward the perimeter, and wherein a width of the base write-read line increases as the base write-read line extends from the via toward the perimeter.

6. The memory cell of claim 1,
- wherein each segment of each write-read line is configured such that a current passing through a given write-read line creates a magnetic filed that acts on the element,
- wherein a current passing through the given write-read line in a first direction creates a magnetic field acting on the element in a clockwise direction around the hole, and
- wherein a current passing through the given write-read line in a second direction creates a magnetic field acting on the element in a counterclockwise direction around the hole.

7. The memory cell of claim 1, wherein the element has an outside diameter of approximately 0.5 micrometers.

8. The memory cell of claim 1, wherein the ring-shaped magnetoresistive multilayer element is a magnetic tunnel junction with a minimum resistance to a current passing perpendicularly through the layers of approximately 20 K ohms and a magnetoresistance ratio of approximately 40 percent.

9. A magnetoresistive memory array comprising:
- a plurality of ring-shaped multilayer magnetoresistive elements arranged in rows and columns, each element having an inner circumference, an outer circumference, a top edge, and a bottom edge, wherein the inner circumference defines a center hole of the element;
- a plurality of row write-read lines, wherein each row write-read line has an associated row, each row write-read line comprising:
  - a first half of the row write-read line passing from a first side of the associated row to a second side of the associated row, wherein the first half of the row write-read line passes through the center hole of each element in the associated row;
  - a second half of the row write-read line passing from the second side of the associated row to the first side of the associated row, wherein the second half of the row write-read line passes through the center hole of each element in the associated row; and
  - a loop for interconnecting the first half of the row write-read line with the second half of the row write-read line at the second side of the row;
- a plurality of column write-read lines, wherein each column has an associated column write-read line, each column write-read line comprising:
  - a first half of the column write-read line passing from a first side of the associated column to a second side of the associated column, wherein the first half of the column write-read line passes through the center hole of each element in the associated column;
  - a second half of the column write-read line passing from the second side of the associated column to the first side of the associated column, wherein the second half of the column write-read line passes through the center hole of each element in the associated column; and
  - a loop for interconnecting the first half of the column write-read line with the second half of the column write-read line at the second side of the column.

10. The array of claim 9,
- wherein each row write-read line has a repeating pattern that spans two elements, and
- wherein each column write-read line has a repeating pattern that spans two elements,
- whereby the array has a minimum write repeating pattern that spans a four-by-four array of elements.

11. The array of claim 9, wherein the array has a minimum write repeating pattern that spans a single element.

12. The array of claim 9, further comprising a redundancy scheme wherein a plurality of elements are used to store a single bit of data.

13. The array of claim 9, further comprising a plurality of bit lines, wherein at least one bit sense line is associated with each element for determining a value indicative of a resistance across the element.

14. The array of claim 9, further comprising:
a row switch for delivering a row write current connected with the first half of each row write-read line on the first side;
a row drain connected with the second half of each row write-read line on the first side;
a column switch for delivering a column write current connected with the first half of each column write-read line on the first side; and
a column drain connected with the second half of each column write-read line on the first side.

15. The array of claim 9, wherein a ferromagnetic storage ring layer of a given element is configured to invert its magnetization direction in response to a magnetic field of at least a first threshold strength applied on the element.

16. The array of claim 15, wherein the magnetic field of at least a first threshold strength is generated by a combination of a first current passing through a row write-read line associated with the given element and a second current passing through a column write-read line associated with the given element.

17. The array of claim 15, wherein a ferromagnetic sense ring layer of the element is configured to invert its magnetization direction in response to a magnetic field of at least a second threshold strength applied on the element, wherein the first threshold strength is greater than the second threshold strength.

18. A magnetoresistive memory cell comprising:
a ring-shaped magnetoresistive multilayer element having a base, a top, a hole passing through the center of the element, and a curved surface at the perimeter of the element;
four vias arranged within the hole, wherein each via extends from the base to the top and is electrically isolated from the element and from the other vias;
a first x-axis top trace arranged near the top and coupled with a first via of the four vias;
a first x-axis base trace arranged near the base and coupled with the first via;
a second x-axis top trace arranged near the top and coupled with a second via of the four vias;
a second x-axis base trace arranged near the base and coupled with the second via;
a first y-axis top trace arranged near the top and coupled with a third via of the four vias;
a first y-axis base trace arranged near the base and coupled with the third via;
a second y-axis top trace arranged near the top and coupled with a fourth via of the four vias;
a second y-axis base trace arranged near the base and coupled with the fourth via,
wherein each trace extends radially from the hole past the perimeter.

19. The memory cell of claim 18, wherein the hole has four quadrants and each via is isolated within a separate quadrant.

20. The memory cell of claim 18, wherein the ring-ring-shaped magnetoresistive multilayer element further comprises:
a ferromagnetic storage ring layer for storing a bit of data;
a ferromagnetic sense ring layer for interrogating the storage layer; and
a nonmagnetic spacer ring layer sandwiched between the storage ring layer and the sense ring layer,
wherein a coercivity of the storage ring layer is greater than a coercivity of the sense ring layer.

21. The memory cell of claim 20, wherein a difference in coercivities of the ferromagnetic layers is created by a difference in thickness of the layers.

22. The memory cell of claim 18, wherein the ring-shaped magnetoresistive multilayer element is toroidally shaped.

23. The memory cell of claim 18, wherein the ring-shaped magnetoresistive multi layer element is cylindrically shaped.

24. The memory cell of claim 18, wherein the ring-shaped magnetoresistive multilayer element is a magnetoresistive bit selected from a giant magnetoresistive spin-valve, a magnetic tunnel junction spin valve, a giant magnetoresistive pseudo spin-valve, and a magnetic tunnel junction pseudo spin-valve.

25. The memory cell of claim 18, further comprising:
a top bit sense line coupled with the top; and
a base switch interconnecting the base with a ground,
wherein a measure of the voltage difference between the top bit sense line and base switch is useful for determining a logical state of the ring-shaped multilayer ring-shaped magnetoresistive multilayer element.

26. The memory cell of claim 18, wherein a combined effect of the traces is to provide an equivalent of four turns of current distributed around the surface of the top and the surface of the base.

27. The memory cell of claim 18, wherein the traces are configured to provide substantially uniform radial currents and corresponding circumferential magnetic fields around the multilayer element.

* * * * *